United States Patent
Matsuda

(10) Patent No.: US 7,292,056 B2
(45) Date of Patent: Nov. 6, 2007

(54) MEMBRANE WITH BUMPS, METHOD OF MANUFACTURING THE SAME, AND METHOD OF TESTING ELECTRICAL CIRCUIT

(75) Inventor: Izuru Matsuda, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 70 days.

(21) Appl. No.: 11/244,138

(22) Filed: Oct. 6, 2005

(65) Prior Publication Data
US 2006/0076967 A1    Apr. 13, 2006

(30) Foreign Application Priority Data
Oct. 8, 2004 (JP) .............................. 2004-296948

(51) Int. Cl.
G01R 31/02  (2006.01)
(52) U.S. Cl. ..................................... 324/754
(58) Field of Classification Search ............... None
See application file for complete search history.

(56) References Cited

U.S. PATENT DOCUMENTS 6,297,658 B1 * 10/2001 Nakata et al. .............. 324/765
6,406,991 B2 * 6/2002 Sugihara ....................... 438/15
2003/0020502 A1 * 1/2003 Sugihara et al. ............ 324/754
2004/0046582 A1 * 3/2004 Sugihara ..................... 324/756

FOREIGN PATENT DOCUMENTS

| JP | 6-232222 | 8/1994 |
| JP | 8-235935 | 9/1996 |
| JP | 3098130 | 8/2000 |
| JP | 2005-172509 | 6/2005 |

* cited by examiner

Primary Examiner—Jermele Hollington
(74) Attorney, Agent, or Firm—Wenderoth, Lind & Ponack, L.L.P.

(57) ABSTRACT

Provided is a membrane with bumps whose variations in shape are minimized to a least extent and which are capable of supporting a micro electrical circuit. The membrane with bumps includes: a plurality of bumps, each of which is made up of a probe and an electrode, with the probe having a diameter which becomes smaller from one end toward another end of the probe, and with the electrode having a diameter which is larger than the diameter of the one end of the probe; and an insulating base where the bumps are positioned at predetermined locations so that the bumps are insulated from each other, wherein the probe is positioned, penetrating the insulating base in a thickness direction, and a metal film is placed between the electrode and the insulating base.

6 Claims, 12 Drawing Sheets

Conductive rubber 51

MEMBRANE WITH BUMPS, METHOD OF MANUFACTURING THE SAME, AND METHOD OF TESTING ELECTRICAL CIRCUIT

BACKGROUND OF THE INVENTION (1) Field of the Invention

The present invention relates to a membrane with bumps for testing a fine electrical circuit formed on a semiconductor wafer, a liquid crystal display panel, a solar battery, or the like by causing the bumps to have surface contact with contacting parts of the fine electrical circuit so as to have plural electrical contacts simultaneously, as well as relating to a method of manufacturing a probe card including such membrane with bumps, and the like.

(2) Description of the Related Art

In recent years, there has been an active effort underway to achieve higher accuracy and higher speed, as well as larger semiconductor devices in order to provide more sophisticated semiconductor devices, or the like and to reduce costs. For example, there has been an ongoing effort to achieve a finer patterning of electrical circuits formed on a semiconductor wafer as well as a larger wafer of a semiconductor wafer. Therefore, for a test of operation of an electrical circuit, pitch intervals between contacting parts are required to be smaller and thus a number of electrical contacts to be provided simultaneously is required to be larger.

The following describes a conventional method of manufacturing a probe card (for example, refer to Japanese Laid-Open Patent application No. 08-235935).

Referring to FIG. 1, a through-hole 1102 is formed in a polyimide film 1101. Then, such through-hole 1102 is filled with a metal substance, so that a rivet-shaped metal projection 1104 is formed, with the rivet-shaped metal projection 1104 including swollen portions 1103, on both surfaces of the above-mentioned film, whose diameters are larger than a diameter of the through-hole 1102. A shape of this rivet-shaped convex electrode 1104 is a typical shape of electrodes formed by a metal plating method, as disclosed in Japanese Patent No. 3098130 (hereinafter referred to as Patent Document 2).

However, since such rivet-shaped convex electrode 1104 is formed by a metal plating method, it is difficult to control its shape. It is extremely difficult to control a size of diameters of the swollen portions 1103 since their diameters are greatly affected by various factors such as accuracy of forming a hole in the polyimide film 1101, a shape and surface roughness of such hole, as well as a chamfered shape.

A result of an evaluation conducted by the inventor of the present invention (hereinafter simply referred to as "the present inventor") shows that, when one-thousand rivet-shaped convex electrodes 1104 whose swollen portions are 100 μm in diameter were formed, diameters of these resulting swollen portions were in a range φ100±10 μm, and thus that it was difficult to have equal and normal electrical contacts by all electrodes. In a case where the number of convex electrodes is increased, it is possible that there will be increased variations in shape of their swollen portions.

Meanwhile, in a case where a rivet-shaped convex electrode 1104 is formed by a plating method, its swollen portion does not have a beautiful semispherical shape but a squashed shape as shown in FIG. 2.

A probe card is used to have plural electrical contacts simultaneously by causing convex electrodes 1104 and contacting parts of an electrical circuit to have surface contact. Thus, in a case where diameters of the convex electrodes 1104 are not uniform and do not have a beautiful semispherical shape, the following problems occur: a size of contacting parts to come in contact with such convex electrodes 1104 are required to be larger than necessary, which results in a defect in a case of a fine electrical circuit; and a predetermined electrical contact cannot be assured unless a greater pressing force is applied.

Furthermore, since it is difficult to control the swollen portions 1103, which are grown by performance of natural plating growth, there is also a serious problem in that many defects occur and thus costs for probe cards increase due to lowered yields.

The following describes a method of manufacturing a probe card according to a second conventional technology (for example, refer to Patent Document 2).

The method disclosed in this Patent Document 2 is a solution to problems of technology disclosed in Patent Document 1. Referring to FIG. 3, an anisotropic conductive film 1302 is added between convex electrodes 1104 and a wiring circuit 1303 in order to assure electrical continuity by absorbing variations in a height of the convex electrodes 1104 caused by non-uniform diameters of the convex electrodes 1104, which is a problem in Patent Document 1. With this structure, each electric signal generated by an electrical circuit 1301 to be tested is independently transmitted to the wiring circuit 1303 via a pressed portion formed by the convex electrode 1104 pressing a portion of the anisotropic conductive film 1302.

However, since this method uses the anisotropic conductive film 1302, which is relatively expensive, there is a problem of an increased cost and a shortened useful lifetime due to deterioration of the anisotropic conductive film 1302. More specifically, the anisotropic conductive film 1302 is made of elastic film in which conductive particles are arranged, and by being pressed to a certain degree, conductive particles in such pressed portion adhere to one another to allow electricity to flow. However, in a case where an operational test of the electrical circuit 1301 is conducted under temperatures in a range between 20° C. and at least 100° C., the elastic film expands and contracts greatly in a planar direction of the film due to thermal expansion. Furthermore, the above test is conducted, in general, for plural times by exchanging test subjects, and the elastic film is pressed with a certain degree of force every time a test is conducted, as is disclosed in Patent Document 2. Under these circumstances, electrical resistance values of the conductive particles included in the anisotropic conductive film 1302 vary with time since a shape of the elastic film constantly changes by being pressed, although such electrical resistance values are stable when the conductive particles are in an original arrangement. In other words, since the original arrangement of the conductive particles changes due to distortion caused by thermal expansion and contract and distortion caused by a repeatedly applied load, their electric resistance values become unstable.

A result of an evaluation conducted by the present inventor shows that, the electric resistance values of contacting parts of the anisotropic conductive film 1302 tend to be greater after the operational test of the electrical circuit 1301 is conducted several hundred times, and thus that stable test results cannot be achieved.

SUMMARY OF THE INVENTION

The present invention has been conceived in view of the above problems of the conventional technologies, and it is an object of the present invention to provide a membrane with bumps that is capable of providing electrical contacts with high accuracy and allowing electrical circuit tests to be stably conducted even when such membrane is used repeatedly, in tests of electrical circuits formed on a semiconductor wafer, a liquid crystal display panel, a solar battery, or the like, even in a case where electrodes on such electrical circuits have narrower pitch intervals therebetween and thus there are an increased number of electrodes.

In order to solve the above problems, the membrane with bumps according to the present invention includes: a plurality of bumps, each of which is made up of a probe and an electrode, with the probe having a diameter which becomes smaller from one end toward another end of the probe, and with the electrode having a diameter which is larger than the diameter of the one end of the probe; and an insulating base where the bumps are positioned at predetermined locations so that the bumps are insulated from each other, wherein the probe is positioned, penetrating the insulating base in a thickness direction, and a metal film is placed between the electrode and the insulating base.

Since the diameter of each bump of this membrane with bumps is smaller from one end toward the other end of the probe, even in a case where pitch intervals between parts to be contacted, e.g., electrodes of an electrical circuit, are small, it is possible to receive signals from respective electrodes by causing the bumps to come into contact with the respective electrodes in an accurate manner.

Furthermore, since the electrodes equipped to the respective bumps are bonded to the insulating base by the metal film that supports such bumps, their bonding strength is increased, and thus it becomes difficult for bumps to fall from the insulating base.

Furthermore, it is preferable that in the membrane with bumps according to the present invention, a part of each of the bumps is an isotropic elastic conductor.

Accordingly, even in a case where (a) there are slight variations in height of parts to be contacted, e.g., electrodes, (b) there are common differences in a shape of bumps themselves, and (c) there are differences in a degree of frictional wear of bumps as a result of a repeated use of the membrane with bumps, it is possible to assure highly accurate, stable electrical contacts by absorbing such variations and differences.

Moreover, in order to solve the above problem, a method of manufacturing a membrane with bumps according to the present invention includes: preparing a lamellar body in which a metal film layer, an insulating body layer, a mold base layer, and a stop layer are laminated in order of mention; forming micro holes in the lamellar body, with each of the micro holes having a diameter which is smaller from the metal film layer toward the mold base layer; forming a resin pattern layer on a surface of the metal film layer that does not face the insulating base layer, with the resin pattern layer having apertures, each of which is continuous with the micro hole and whose diameter is larger than a diameter, of the micro hole, at a surface of the metal film layer that does not face the insulating base layer; forming bumps, each of which has a probe and an electrode, by filling the micro holes and the apertures with a conductive material, with the probe having a diameter which becomes smaller from one end toward another end of the probe, and the electrode having a diameter which is larger than the diameter of the one end of the probe; removing a part of the metal film layer so that the bumps become insulated from each other; removing the mold base layer from the insulating base layer; and removing the resin pattern layer.

Accordingly, it is possible to form a large number of bumps having a uniform shape and thus to provide a membrane with bumps whose shape is stable. In particular, since the present method produces bumps with uniform height, it is possible to have stable electrical contacts at all contacting parts.

Furthermore, the same effect is produced by a probe card made up of a wiring circuit board having wiring patterns corresponding to plural semiconductor devices formed on a wafer, and of the above-described membrane with bumps.

Furthermore, a significant solution to the above-described problems is achieved in a case where a test of semiconductor devices is conducted, using the above probe card, by causing the bumps to come into contact with electrodes of respective semiconductor devices.

It should be noted that in the present specification and claims, the term "diameter" refers to not only the diameter of a circle, but also the diameter of a circle whose area size is the same as the size of a non-circular area.

It should be also noted that in the present specification and claims, the metal is not limited to one kind of metal, but it also refers to an alloy including plural kinds of metallic elements or elements other than metal.

The membrane with bumps according to the present invention is capable of providing electrical contacts with high accuracy and allowing electrical circuit tests to be stably conducted even when such membrane is used repeatedly, in tests of electrical circuits formed on a semiconductor wafer, a liquid crystal display panel, a solar battery, or the like, even in a case where electrodes on such electrical circuits have narrower pitch intervals therebetween and thus there are an increased number of electrodes.

The disclosure of Japanese Patent Application No. 2004-296948 filed on Oct. 8, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

First Embodiment

Figure 1:
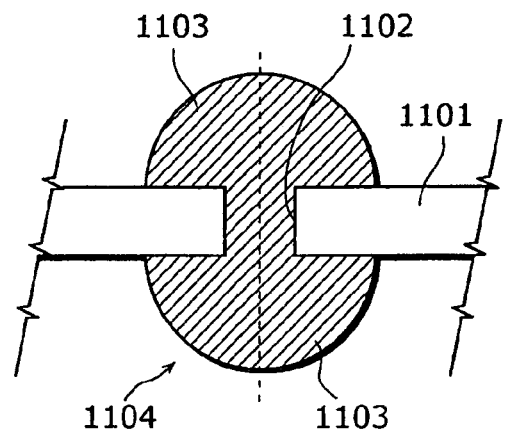
FIG. 1 is a cross-sectional view showing a conventional convex electrode.
Figure 2:
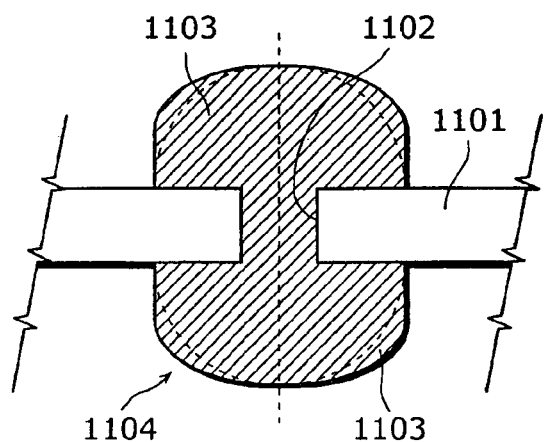
FIG. 2 is a cross-sectional view showing an actual shape of the conventional convex electrode.
Figure 3:
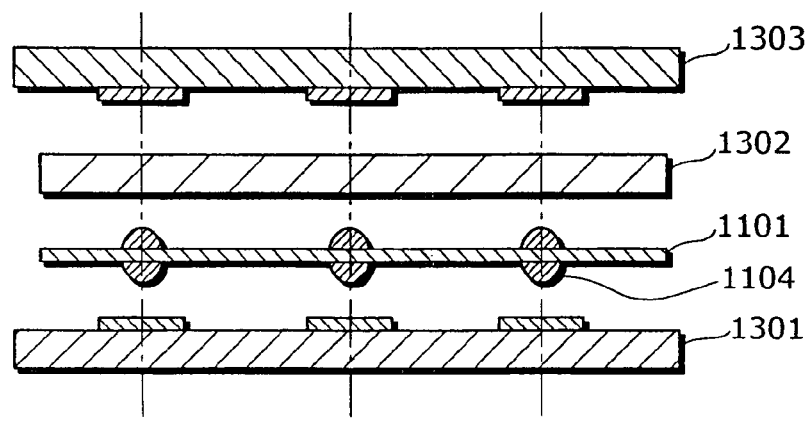
FIG. 3 is a cross-sectional view showing a conventional probe card using an anisotropic conducive film and an electrical circuit being a test subject.

Referring to the drawings, a description is given of a membrane with bumps and a method of manufacturing the same, with each of the bumps serving as an electrical contact terminal of a probe card that is used to test operation of an electrical circuit formed on an eight-inch wafer.

Figure 4:
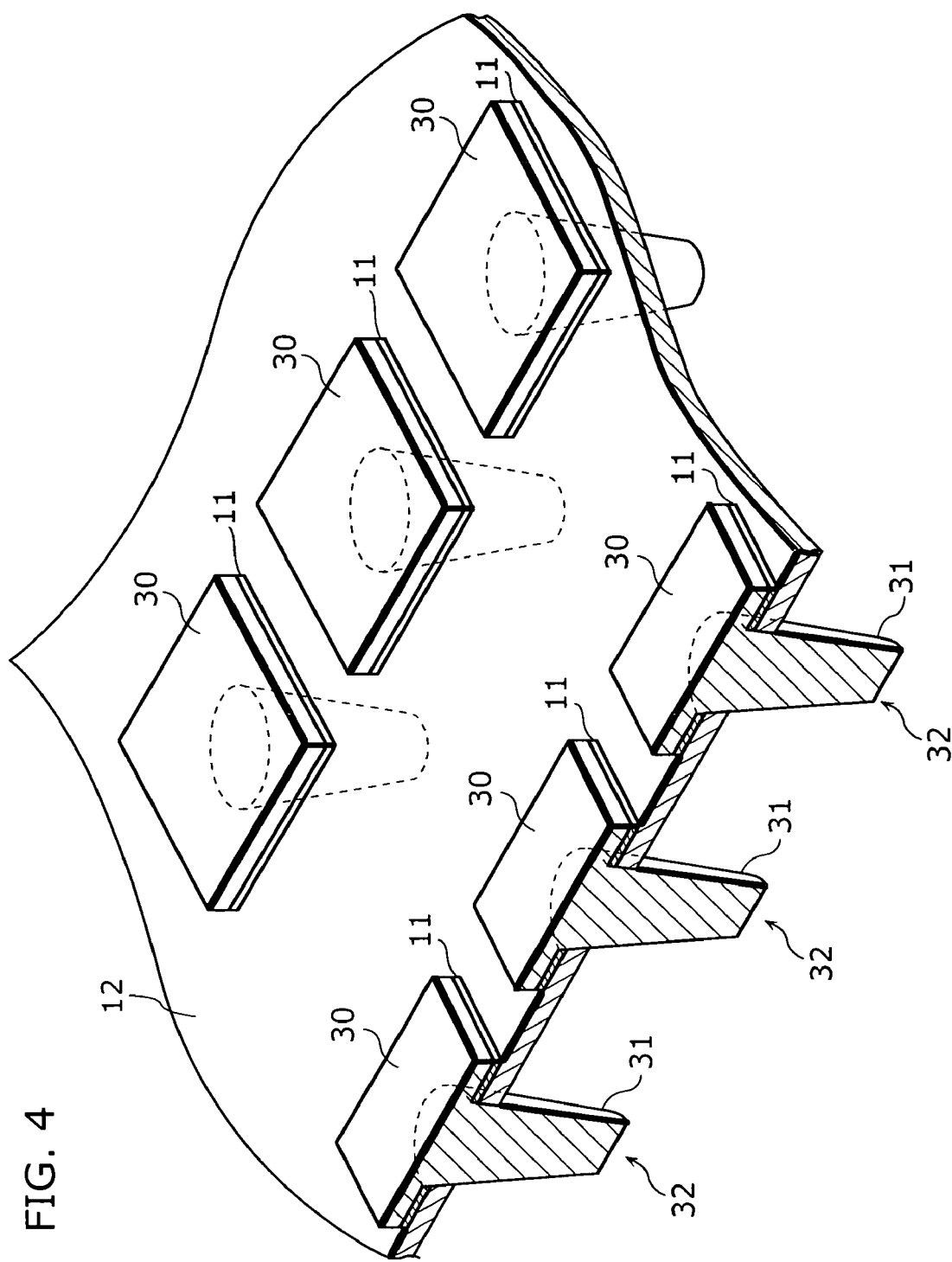
FIG. 4 is a perspective cross-sectional view showing a cutaway part of a membrane with bumps.

FIG. 4 is a perspective cross-sectional view showing a cutaway part of the membrane with bumps. As shown in FIG. 4, the membrane with bumps is made up of: a discoid insulating base 12 with a diameter of 300 mm; bumps 32, each of which has (i) a convex conductive part 31 serving as a probe whose diameter is smaller from a base end toward a tip, and (ii) a square electrode 30 that is integrated with the base end of the convex conductive part 31 and that serves as an electrode whose diameter is larger than a diameter of the base end of the convex conductive part 31; and metal films 11, each of which serves as a metal film layer having the same shape as that of the square electrode 30 and which is not electrically continuous with another metal film 11.

The bumps 32, which are positioned at predetermined locations, are kept insulated from each other by the insulating base 12 serving as an insulating base layer. The convex conductive part 31 which forms a part of each bump 32 penetrates the insulating base 12 in a thickness direction, so that the tip of the convex conductive part 31 protrudes from the insulating base 12. Each bump 32 is firmly bonded to the insulating base 12 by at least the square electrode 30 and the insulating base 12 being bonded by the metal film 11.

Figure 5:
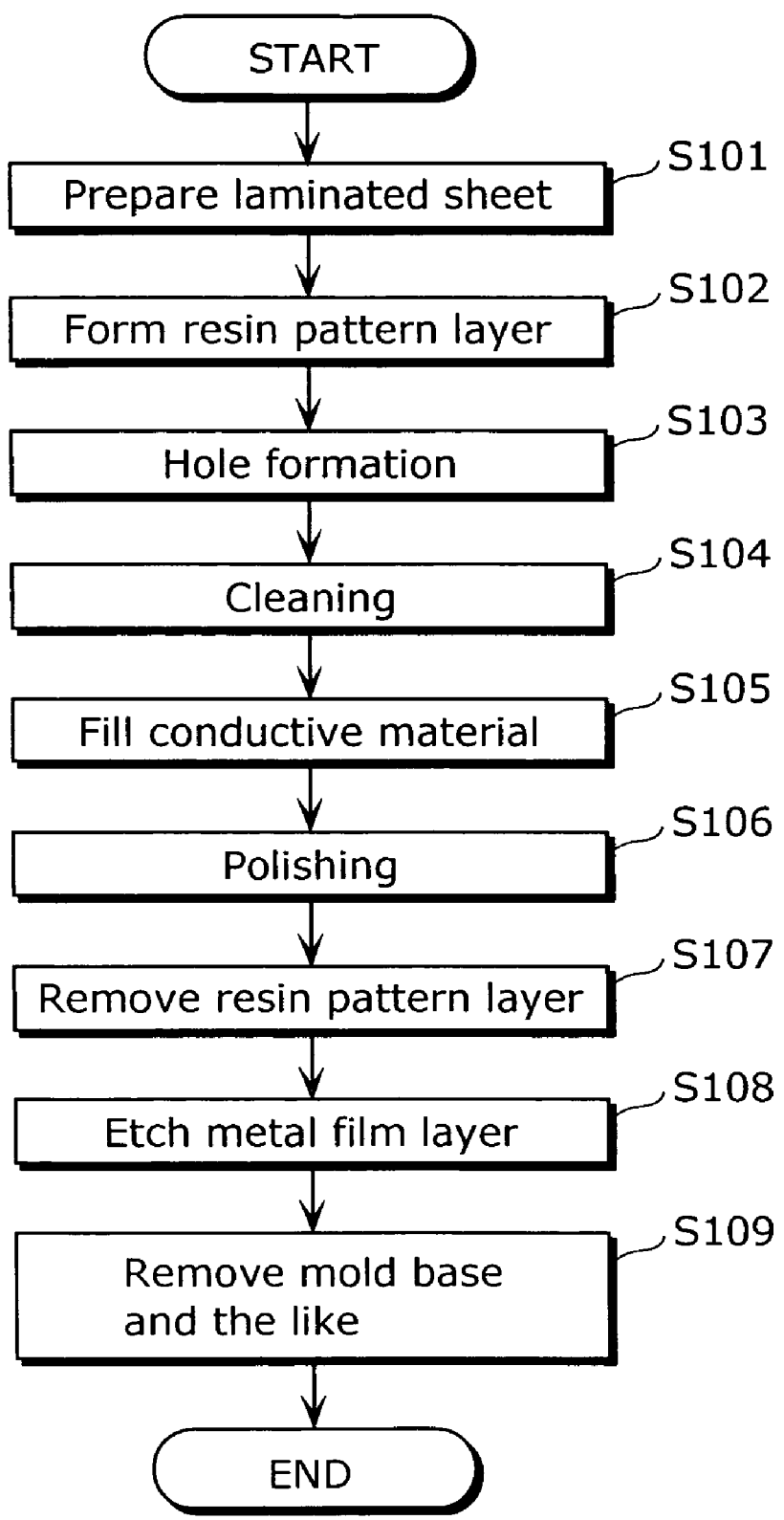
FIG. 5 is a flowchart showing a flow of processes of manufacturing a membrane with bumps according to an embodiment of the present invention.

FIG. 5 is a flowchart showing a flow of processes of manufacturing a membrane with bumps according to the first embodiment.

FIGS. 6A to 6G are cross-sectional views that schematically show a part of a laminated sheet in order of the processes of manufacturing the membrane with bumps.

First, a laminated sheet 10 is prepared as a lamellar body (S101).

Figure 6A:
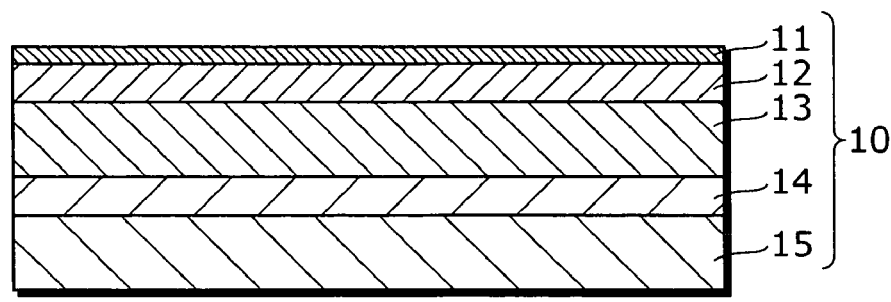
FIGS. 6A to 6G are cross-sectional views that schematically show a part of a laminated sheet in order of the processes of manufacturing the membrane with bumps.

Referring to FIG. 6A, the laminated sheet 10, which has a discoid shape with the diameter of 300 mm, is made up of: a metal film 11 made of a copper thin film with a thickness of 2 μm; an insulating base 12 made of a polyimide resin with a thickness of 25 μm; a mold base 13 made of a resist, with a thickness of 30 μm, which serves as a layer on which molds are formed; a stop layer 14 which is made of a copper thin film with a thickness of 5 μm and at which formation of micro holes are stopped; and a handling layer 15 made of polyethylene terephthalate (PET) resin with a thickness of 300 μm, with the handling layer 15 being positioned as an outermost layer part to allow for easy handling.

Used as the resist making up the mold base 13 is a resist that cures with ultraviolet and heat, and that tacks well with the insulating base 12 and the stop layer 14 positioned above and below the mold base 13.

The polyimide resin making up the insulating base 12 and the mold base 13 are formed as layers by performing lamination, but they are laminated by applying a least possible tension. This lamination method makes it possible to minimize a positional deviation of each bump 32 to at most 5 μm when the mold base 13 is separated. This applies to lamination of the mold base 13 and the stop layer 14.

Meanwhile, the metal film 11 is formed on one surface of the insulating base 12 by performing sputtering which is one of physical vapor deposition methods. Sputtering is suitable as a method of forming the metal film 11 on the insulating base 12 with high adhesion.

Figure 6B:
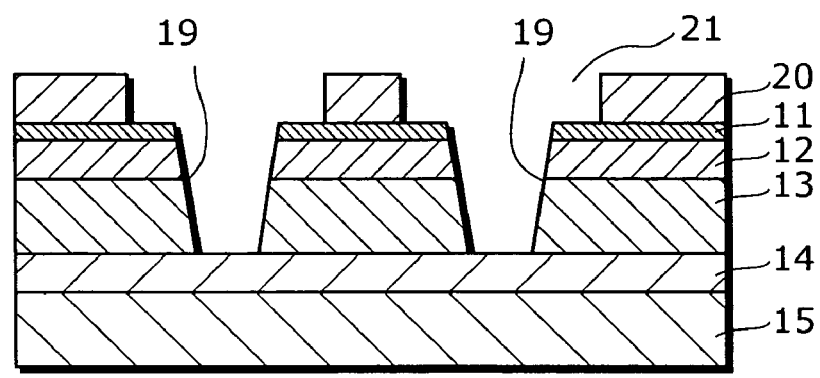

Next, referring to FIG. 6B, as a process of forming a resin pattern layer, a resin pattern layer 20 is formed on an outer surface of the above laminated sheet 10 (S102).

The resin pattern layer 20 is formed in the following manner: a patterning resist with a thickness of 20 μm is applied over an outer surface of the metal film 11; and approximately twenty thousand apertures 21, having a 80 μm by 220 μm square form, are formed by performing exposure at positions to come in contact with an electrical circuit formed on the eight-inch wafer.

Note that a number of apertures 21 differs depending on a type of devices formed on the wafer, since the number of apertures 21 corresponds to a number of bumps 32 to come into contact with an electrical circuit formed on the wafer. A result of evaluation conducted by the present inventor shows that, in the present embodiment, apertures 21 can be formed at a maximum of some forty thousand positions and thus the same number of bumps 32 can be formed.

Next, referring to FIG. 6B, as a process of forming micro holes, holes are formed at respective centers of square-shaped apertures 21 by performing laser beam irradiation (S103). Information about positions to which a laser beam is irradiated is previously inputted, as coordinates, in a program for moving a laser stage, but final positions are determined by recognizing, by use of a CCD camera, a shape of respective apertures 21 formed by exposure, and modifying central positions of such respective apertures 21. Since positions of the apertures 21 formed by exposure are highly accurate and it is possible to form the same apertures 21 in a reproducible manner, there becomes no need to use an expensive laser stage having a positional accuracy of ±10 μm or lower and requiring frequent positional modifications, by modifying positions where holes are to be formed, based on the positions of the apertures 21. What is more, there also becomes no necessity to use a thermostat and humidistat chamber for maintaining accuracy of a highly accurate laser stage. Thus, use of the present embodiment makes it possible to assure high positional accuracy in an inexpensive manner.

As supplemental remarks, a description is given of performance of a current-technology laser beam apparatus. Sizes of holes formed in hole formation are mainly greater than φ50 μm. Thus, a laser stage of the current-technology laser beam apparatus is specified to have positional accuracy that corresponds to a diameter of the holes, i.e., ±10 μm or greater. Regarding the number of holes to be formed, since it is not usual to form as many as five thousand holes in an eight-inch level area, it is more than requirements defined in the laser stage specification to have to satisfy the positional accuracy of each of all twenty thousand holes that are required to be formed according to the present embodiment.

A laser alignment method to be used in the present embodiment is a preferable method since it utilizes the laser stage of the current-technology laser beam apparatus, while solving problems thereof. While a shape and position of each aperture 21, which serves as an alignment mark, are of course required to be highly accurate, there is no problem, with the current technology of exposure and resist material, in assuring accuracy in submicron units in terms of both cost and technology. However, in a case where a square-shaped aperture 21 serving as an alignment mark has an area larger than 0.04 mm$^2$, it is not possible to obtain effective results since such area is not in a recognition range of a CCD camera that can only recognize a positional accuracy of ±5 μm or lower. Thus, a cross-sectional area of each aperture 21 serving as an alignment mark is preferably at most 0.04 mm$^2$ in a planar direction.

Next, a description is given of hole formation by performance of laser beam irradiation. While a certain amount of power is required to penetrate the metal film 11, output power of a laser beam to be irradiated should be low so as to stop the hole formation at a surface of the stop layer 14 after penetrating the insulating base 12 made of a polyimide resin and the mold base 13 made of a resist. The present inventor has achieved penetration of the metal film 11 by irradiating a YAG third harmonic with a wavelength of 355 nm for 0.02 seconds at the output power of 200 mw. Note that irradiation time is calculated by the following equation, where 0.01 indicates the time required to penetrate a unit length by irradiation of a laser beam under the above conditions, and 2 indicates the thickness of the metal film 11:

Irradiation time=0.01(second/μm)×2(μm)=0.02 seconds.

Here, the wavelength of 355 nm is used so that a diameter of each micro hole 19 formed by the hole formation is at most 50 μm. This is because the shorter the wavelength is, the smaller the diameter of a light collecting spot becomes, but the same result is achieved by using a YAG second harmonic with a wavelength of 532 nm in a case where the diameter of each micro hole 19 formed by the hole formation is wished to be at most 50 μm. However, use of a wavelength greater than 550 nm is not preferable since it becomes extremely difficult to obtain a small hole diameter.

Regarding the output power, when a value is less than 80 mW, defects can be caused such as variations in diameter of holes in the metal film 11. Meanwhile, when the value is greater than 500 mW, there is a possibility that the laser beam penetrates or even scrapes off the stop layer 14 regardless of irradiation time. Thus, the output power of the laser beam that can penetrate the metal film 11 with the thickness of 2 μm is preferably in a range between 80 mW and 500 mW inclusive.

In a case where the metal film 11 is thinner than 1 μm, the output power of the laser beam should be further limited. The present inventor has confirmed that the YAG second harmonic with the wavelength of 532 nm reaches and partially resolves the stop layer 14. Thus, by irradiating the YAG third harmonic with the wavelength of 355 nm at the output power of 80 nW, the same result was achieved as that for a case where the thickness of the metal film 11 is at least 1 μm. In the case where the thickness of the metal film 11 is less than 1 μm, the output power of a laser beam used for the hole formation is preferably in a range between 60 mW and 100 mW inclusive since (i) in a case where the output power is less than 60 mW, the metal film 11 cannot be penetrated in a round shape in a stable manner and (ii) in a case where the output power is greater than 100 mW, there occurs oxidation around holes due to thinness of the metal film 11 and subsequent processes are adversely influenced by such oxidation.

As a condition for penetrating the insulating base 12 made of a polyimide resin and the mold base 13 made of a resist and then stopping the hole formation at the surface of the stop layer 14, the YAG third harmonic with the wavelength of 355 nm, as in a case of a condition for penetrating the metal film 11, and an output power of 30 mW are set. Furthermore, as the diameter of a hole, i.e., the diameter of a collected laser beam, σ15 μm±2 μm is set. A reason for selecting such wavelength is as described above. Regarding output power of a laser beam, at an output power less than 10 mW, laser beams cannot be outputted in a stable manner or cannot form holes in a stable manner even in a resist making up the mold base 13 that is relatively easy to scrape off at a lower power. Meanwhile, an output power greater than 50 mW is not preferable since there occurs removal or dissolving of an outer surface of the stop layer 14. Thus, the output power of a laser beam is preferably in the range between 10 mW and 50 mW inclusive.

Conditions for laser beam irradiation are summarized below.

(1) A preferable condition for penetrating metal film 11 with a thickness in a range between 1 μm and 5 μm inclusive is: a wavelength of a laser beam to be irradiated is at most 550 nm; output power of the laser beam is in a range between 80 mW and 500 mW inclusive; and irradiation time is Irradiation time=0.01(second/μm)×the thickness of the metal film 11(μm)±50%.

(2) A preferable condition for penetrating metal film 11 with a thickness in a range between 0.1 μm and 1 μm inclusive is: a wavelength of a laser beam to be irradiated is at most 400 nm; output power of the laser beam is in a range between 60 mW and 100 mW inclusive; and irradiation time is Irradiation time=0.05(second/μm)×the thickness of the metal film 11(μm)±50%.

(3) A preferable condition for penetrating insulating base 12 and mold base 13 whose total thickness is in a range between 1 μm and 500 μm inclusive without penetrating the stop layer, so that the outer surface of such stop layer serves as an undersurface of micro holes 19, is: a wavelength of a laser beam to be irradiated is at most 400 nm; and output power of the laser beam is in a range between 10 mW and 50 mW inclusive.

Note that a thickness of the stop layer 14 is preferably at least 1 μm for a reason that the stop layer 14 needs to have a thickness that can provide resistance to irradiation of laser beams.

It has been proved that, when hole formation is performed in a case where the hole formation should be stopped at the surface of the stop layer 14, by use of a YAG fourth harmonic with a wavelength of 266 nm at an output power in a range between 10 mW and 50 mW inclusive, the outer surface of the stop layer 14 serving as the undersurface of the holes has a center line average roughness of 1 to 3 μm, and thus such surface roughness is transferred to the bumps 32, resulting in a highly favorable effect in conductivity between each bump 32 and an electrical circuit formed on the wafer when they are in contact with each other.

A contacting part of an electrical circuit on the wafer is made of a conductive film, typically aluminum or the like. However, since a natural oxide film is attached on an outer surface of such contacting part, effective electrical continuity cannot be assured unless such natural oxide film is removed or physically broken through at a time of contact. However, according to the present embodiment, use of the bumps 32 to which the surface roughness of the stop layer 14 has been transferred makes it possible to physically break through the above oxide film with ease and thus to assure favorable electrical continuity. This structure leads to a significant reduction in cost since there is no need to newly add a process of removing the oxide film of each electrical circuit on the wafer or no need to transport the wafer in a nitride atmosphere to prevent formation of natural oxide films.

In a case where the surface roughness of the stop layer 14 serving as the undersurface of the holes is less than 1 µm, it becomes hard to break through the above oxide film. Meanwhile, a surface roughness greater than 3 µm makes it difficult to assure favorable electrical continuity since an area to be in contact with an electrical circuit becomes small. Thus, the surface roughness is preferably in a range between 1 µm and 3 µm inclusive.

It should be noted that the same surface roughness as the one described above can be achieved in a case where hole formation is performed by irradiating a krF excimer laser with a wavelength of 248 nm at an output power in a range between 10 mW and 50 mW inclusive.

Next, cleaning is performed to remove a smear (S104).

Figure 6C:
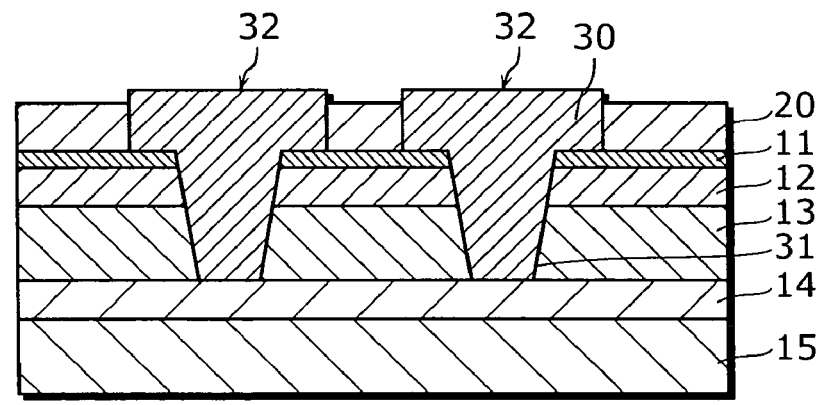

Next, referring to FIG. 6C, as a process of filing a conductive material, each micro hole 19 and aperture 21 is filled with nickel being a conductive material (S105). In the present embodiment, each micro hole 19 and aperture 21 is filled with a conductive material in a manner such that conductive material is filled to exceed a depth of each square-shaped aperture 21 by approximately 20% relative to the depth of such aperture 21, 20 µm. By filling each aperture 21 with a conductive material so that such conductive material protrudes from an opening surface of the aperture 21, it is possible to fill each micro hole 19 and square-shaped aperture 21 with nickel even when there are variations in a speed of plating growth.

Figure 6D:
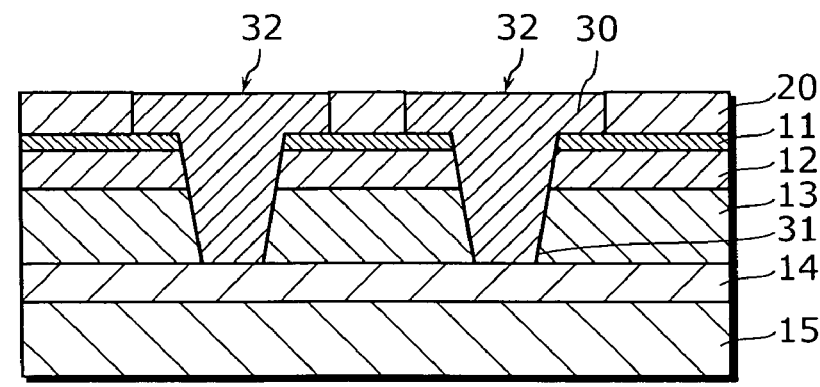

Next, referring to FIG. 6D, a portion protruding from the opening surface of each aperture 21 is removed by polishing since such portion is unnecessary (S106). This polishing is performed until an outer surface of the nickel filled in each aperture 21 becomes the same height as that of an outer surface of the resin pattern layer 20 to form an approximately flat surface.

Figure 6E:
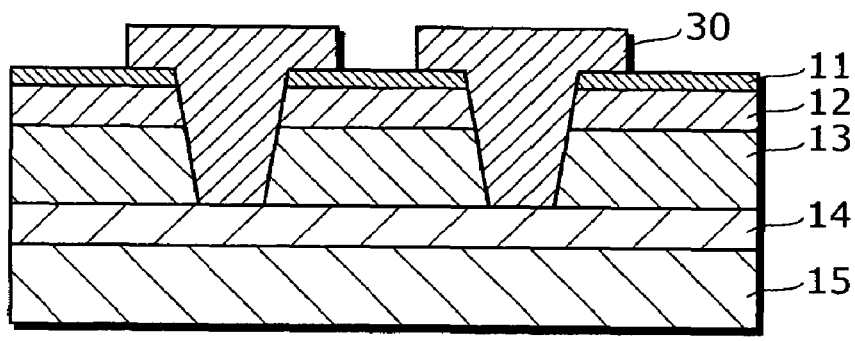

Next, referring to FIG. 6E, as a process of removing the resin pattern layer, the resin pattern layer 20 is removed by performing wet etching (S107). As a result, approximately twenty thousand square electrodes 30 are exposed on the insulating base 12 made of a polyimide resin via the metal film 11, with each of the square electrodes 30 being an electrode which is 80 cm in width, 220 µm in height, and 19 µm in thickness.

Figure 6F:
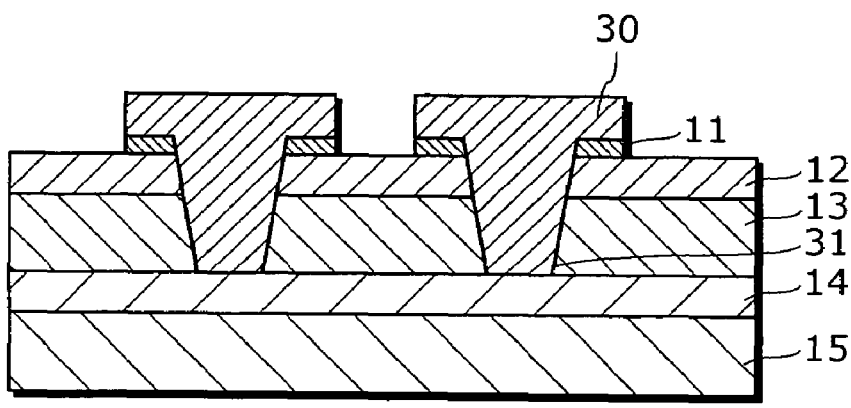

Next, referring to FIG. 6F, as a process of removing the metal film, the metal film 11 is etched using each square electrode 30 as a mask (S108), so that such metal film 11 is left only for portions corresponding to respective square electrodes 30. Accordingly, no electrical continuity is established between every two square electrodes 30 owing at least to existence of the metal film 11.

Through this process, outer edges of each square electrode 30 and each remaining metal film 11 become approximately flat. Note that this etching process is controlled so that a common difference in a size of an outer edge of each metal film 11 is ±10 µm relative to a size of the outer edge of a corresponding square electrode 30. Such control is necessary since (i) a bonding strength between the insulating base 12 and each bump 32 becomes low in a case where the outer edge of each metal film 11 comes 10 µm inside the outer edge of the corresponding square electrode 30, and (ii) there is a high possibility that a short circuit occurs between adjacent square electrodes 30 in a case where the outer edge of each metal film 11 protrudes the outer edge of the corresponding square electrode 30 by 10 µm.

Note that especially in a case where pitch intervals between square electrodes 30 is small (around 100 µm), it is preferable that the etching process is strictly controlled so that a common difference in size of the outer edge of each metal film 11 is ±5 µm relative to a size of the outer edge of the corresponding square electrode 30.

In the present embodiment, the metal film 11 is grown, on the outer surface of the insulating base 12 made of a polyimide resin, to the thickness of 2 µm by performing sputtering. As a result, a strength of adhesion between the insulating base 12 and the metal film 11 is high, and a peel strength of 3N/cm has been achieved.

As described above, since a high adhesion strength is ensured between the metal film 11 and the insulating base 12 first, and then square electrodes 30 are formed using plating which can be highly adhesive to such metal film 11, the insulating base 12 and the square electrodes 30 are firmly bonded by the metal film 11. As a result, the bumps 32 are prevented from falling off from the insulating base 12.

Furthermore, in addition to the filling of a conductive material by a plating method, it is also possible to prevent the bumps 32 from falling off the insulating base 12 by filling each micro hole 19 and aperture 21 with conductive silver paste by performing screen printing since conductive silver paste makes it hard for each metal film 11 and each square electrode 30 to be separated from each other. This is because, since an organic film (e.g., polyimide resin) has a poor wettability to conductive silver paste, in general, a metal film having a high adhesion is applied to the organic film, and then conductive silver paste is applied over such metal film.

Figure 6G:
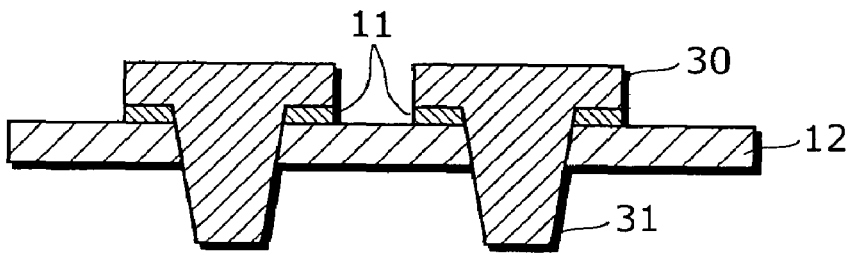

Next, referring to FIG. 6G, the stop layer 14 and the handling layer 15 that is made of PET are removed from the mold base 13, and as a process of removing the mold base layer, the mold base 13 made of a resist is removed by performing wet etching (S109). Note that the stop layer 14 and the handling layer 15 can be easily removed from the mold base 13 by applying physical force.

Through the above processes, convex conductive parts 31, each serving as a probe, are formed on an opposite side from which the square electrodes 30 are formed.

The present embodiment has an advantage of being able to process the mold base 13 and the resin pattern layer 20 by the same wet etching apparatus since the same material is used for the mold base 13 and the resin pattern layer 20.

In the present embodiment, a diameter of the tip of each convex conductive part 31 is ϕ18 µm±2 µm for a reason that the diameter of the tip of each micro hole 19 is slightly larger at a time of the hole formation performed by laser beam irradiation, after smear cleaning or the like is performed.

Note that an amount of enlargement in the diameter of each micro hole 19 due to smear cleaning or the like is stable, and thus it is possible to control a diametrical size of the tip of each convex conductive part 31 so that it has a desirable diametrical size by previously setting an expected diametrical size of each convex conductive part 31 at the time of hole formation.

Furthermore, a height of each convex conductive part 31 protruding from the other surface of the insulating base 12 is determined depending on a thickens of the mold base 13. In the present embodiment, it has been possible to control the height of all the convex conductive parts 31 to be within 30 μm±0.5 μm. As described above, since there are few variations in the height of the bumps 32 which exist in large number, it is possible to make a significant improvement in performance in electrical contact between each bump 32 and each electrical circuit on the wafer.

As described above, by creating a mold using the laminated sheet 10 serving as a lamellar body and the resin pattern layer 20, and then by filling such mold with a conductive material, it becomes possible to easily control a shape as well as accuracy of each bump 32. Compared with the conventional technology that creates a rivet-shaped bump using plating by having such plating swell freely, the method of the present embodiment is easy and effective. Thus, it is possible for the present invention to make a significant improvement in yields of the membrane with bumps 32.

Furthermore, since the resin pattern layer 20 is formed using technology of exposure and resist material, and using such pattern both as a mold of a bump 32 and as an alignment mark, it is possible for the present invention to produce, at the same time, contradictory effects of improving positional accuracy of each bump 32 and reducing manufacturing cost of bumps 32.

Second Embodiment

Referring to the drawings, a description is given of a second embodiment of the present invention.

Figure 7:
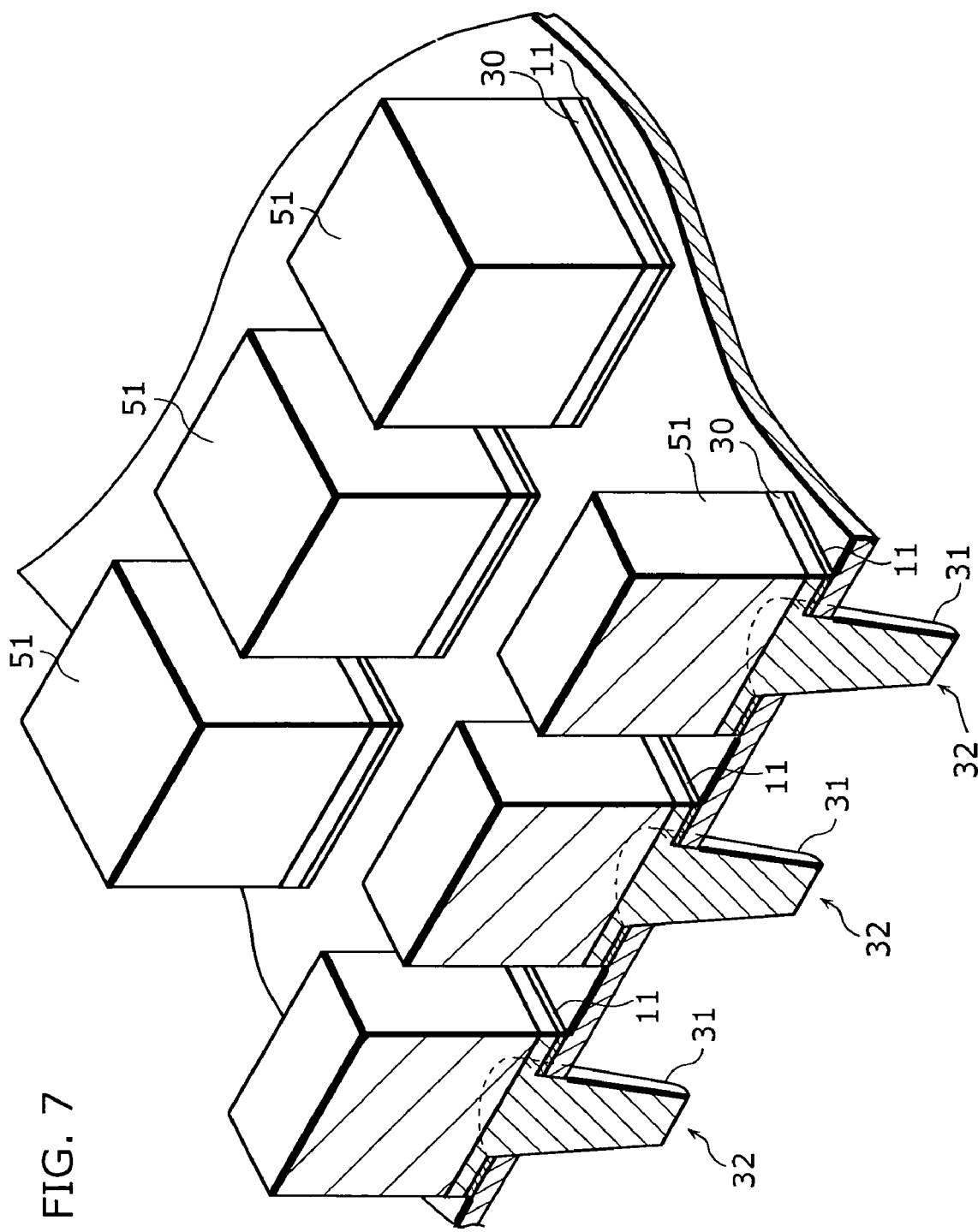
FIG. 7 is a perspective cross-sectional view showing a cutaway part of a membrane with bumps and isotropic elastic conductors.

FIG. 7 is a perspective cross-sectional view showing a cutaway part of a membrane with bumps and with isotropic elastic conductors.

In this drawing, the membrane with bumps is the same as the one described in the first embodiment except that the membrane with bumps of the second embodiment includes isotropic elastic conductors 51 bonded above respective square electrodes 30, wherein each of the isotropic elastic conductors 51 is electrically continuous with a corresponding bump 32.

Each of the above isotropic elastic conductors 51, which is made of isotropic conductive rubber, has elasticity of being able to deform when applied with a force and recovering its shape when the force is released, and whose conductivity does not change even when applied with pressure.

Figure 8:
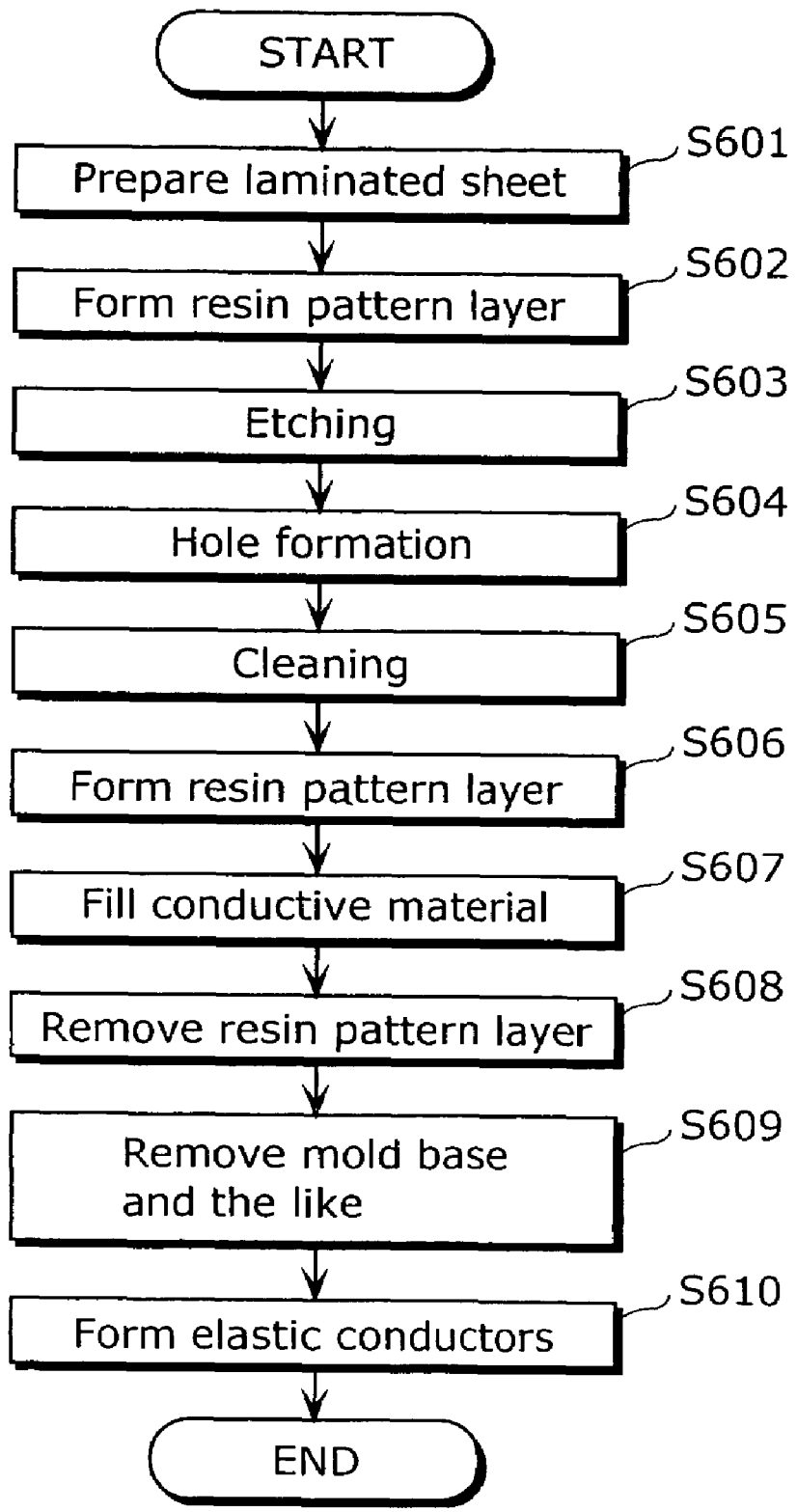
FIG. 8 is a flowchart showing a flow of processes of manufacturing a membrane with bumps according to another embodiment of the present invention.

FIG. 8 is a flowchart showing a flow of processes of manufacturing a membrane with bumps according to the second embodiment.

First, a laminated sheet 10 is prepared as in the case of the first embodiment (S601).

Next, a resin pattern layer 20 is formed on an outer surface of the laminated sheet 10 on which a metal film 11 is formed (S602). Such resin pattern layer 20 serves as a mask at a time of etching the metal film 11. On such resin pattern layer 20, resist is applied at each position where a square electrode 30 is formed, and no resist is applied to other parts.

Next, as a process of removing the metal film, the metal film 11 is etched to remove unnecessary portions (S603).

Next, using each remaining metal film 11 as an alignment mark, a micro hole 19 is formed by performing laser beam irradiation, while modifying a position of hole formation using a CCD camera (S604). The same conditions for laser beam irradiation as the ones described above are used here. By using each remaining metal film 11 as an alignment mark, a mark and a position of hole formation are on the same plane, which enables hole formation to be performed with a higher accuracy.

After cleaning is performed (S605), a resin pattern layer 20 is additionally formed (S606). A thickness of this resin pattern layer 20 made of patterning resist is 5 μm.

Such newly formed resin pattern layer 20 is intended for controlling a shape of each square electrode 30, and an aperture 21 is formed, on such resin pattern layer 20, at a position corresponding to each remaining metal film 11.

Next, bumps 32 are formed by filling the apertures 21 with a conductive material, as in the case of the first embodiment (S607).

Next, the resin pattern layer 20 is removed (S608), and mold base 13 and the like are removed (S609).

Figure 9A:
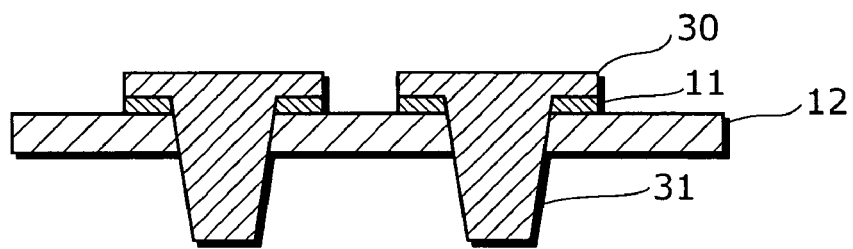
FIGS. 9A and 9B are cross-sectional views showing square electrodes onto which isotropic elastic conductors are respectively formed.

Through the above processes, referring to FIG. 9A, square electrodes 30, each being 80 μm in width, 220 μm in height, and approximately 4 μm in thickness, are bonded, via the metal film 11, above insulating base 12 which is 300 mm in diameter and which is made of a polyimide resin, and approximately twenty thousand bumps 32, each having a convex conductive part 31, are formed. A diameter of a tip of each convex conductive part 31 is φ18 μm±2 μm, and a height of each convex conductive part 31 from an outer surface of the insulating base 12 is in a range of 30 μm±0.5 μm, as in the case of the first embodiment.

Figure 9B:
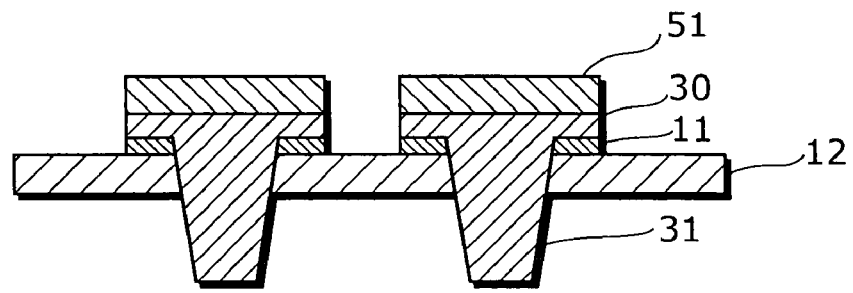

Next, referring to FIG. 9B, isotropic elastic conductor 51 made of isotropic conductive rubber is formed on each square electrode 30 (S610). First, a silicon isotropic conductive rubber sheet with the thickness of 20 μm is bonded, using conductive adhesive, on a side of the square electrodes 30 on which the square electrodes 30 do not face the corresponding metal film 11. Then, using the same position modification program as is used in forming holes by performing laser beam irradiation, the isotropic conductive rubber sheet is cut out by a laser beam in accordance with an outer shape of each square electrode 30. Through the above processes, isotropic elastic conductors 51 are formed on respective twenty thousand square electrodes 30 in an individually separate manner.

In the present embodiment, isotropic elastic conductor 51 provides spring-like elasticity in a height direction when a convex conductive part 31 is pressed against an electrical circuit on the wafer. It has been confirmed that, by causing an electrical contact in a state where a thickness of each isotropic elastic conductor 51 is reduced to 15 μm from 20 μm through application of pressure, all of the bumps 32 which are positioned with a very high density of, for example, at least 0.32 bumps/mm$^2$, easily have electrical continuity with an electrical circuit.

The manufacturing method employed in the second embodiment is suitable for a case where the metal film 11 and the bumps 32 are etched using the same etching agent.

A total thickness of an isotropic elastic conductor 51, a square electrode 30, and a convex conductive part 31 is about 71 μm, but it is desirable that the thickness of the isotropic elastic conductor 51 changes at least by 10% (compressed) relative to such total thickness in order to make a stable electrical contact. This is because, if a change in thickness is less than 10%, it is impossible to assure favorable electrical contacts by absorbing slight variations in thicknesses of the bumps 32. Meanwhile, a change in thickness greater than 50% is not preferable since such a change is too much load on a test subject, and thus may cause damage to such test subject. Furthermore, the isotropic elastic conductors 51 are also capable of absorbing slight variations in a height of contacting parts formed on the wafer being tested. The present inventor has confirmed that, in a case where variations in the height of the contacting parts is at most 40 μm, isotropic elastic conductors 51 with a thickness of 200 μm can support such variations.

Furthermore, as a method of applying an isotropic elastic conductor 51 onto a square electrode 30, an isotropic elastic conductor 51 sheet may be cut out using a mold, to be applied onto the square electrode 30.

Third Embodiment

Referring to the drawings, a description is given of the third embodiment of the present invention.

Figure 10:
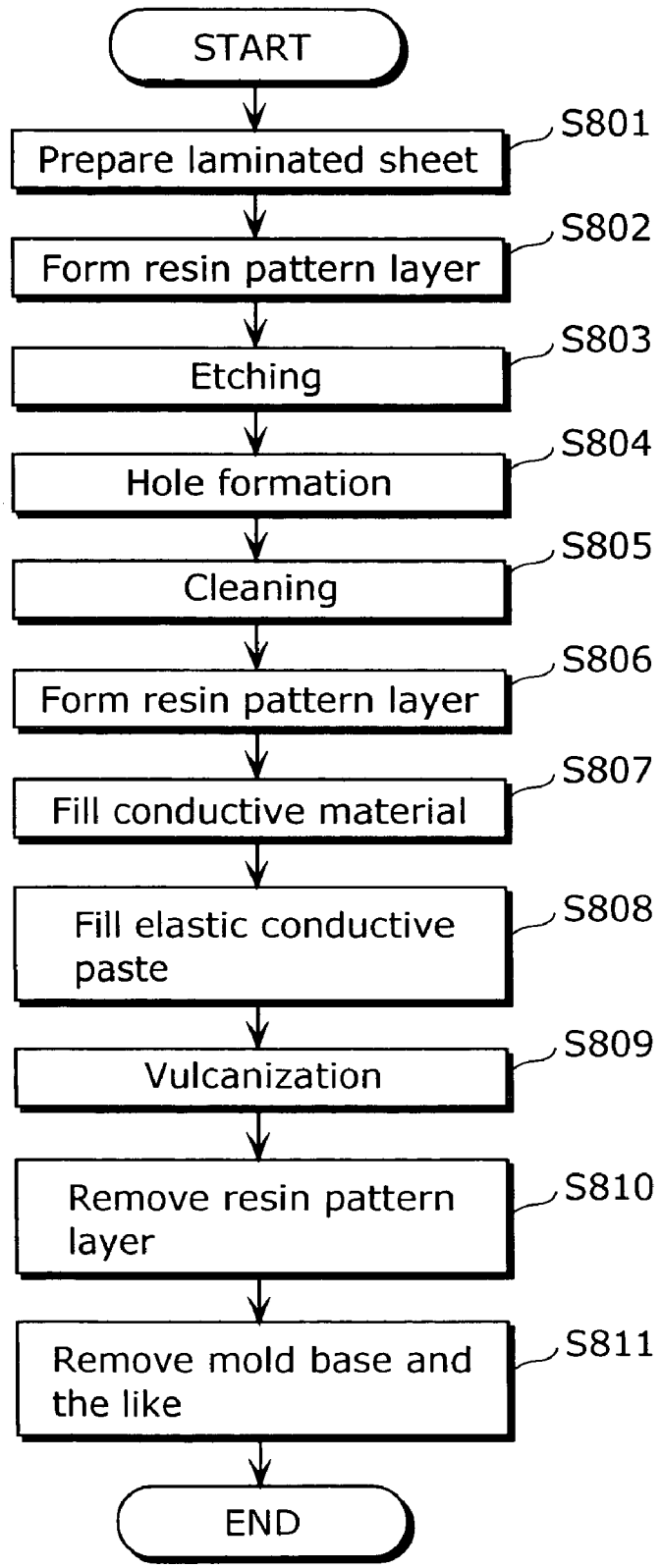
FIG. 10 is a flowchart showing a flow of processes of manufacturing a membrane with bumps according to a further another embodiment of the present invention.

FIG. 10 is a flowchart showing a flow of processes of manufacturing a membrane with bumps according to the third embodiment.

The processes from preparation of a laminated sheet 10 (S801) up to cleaning (S805) are the same as those described in the second embodiment, and therefore descriptions thereof are not given.

Next, a resin pattern layer 20 made of patterning resist with a thickness of 25 μm is formed on an outer surface of the laminated sheet 10 on which a metal film 11 is formed (S806). Such newly formed resin pattern layer 20 is intended for controlling the shape of each square electrode 30 as well as a shape of each isotropic elastic conductor 51 which is relatively great in height, and an aperture 21 is formed, on such resin pattern layer 20, at a position corresponding to each remaining portion of metal film 11.

In the third embodiment, as in the case of the second embodiment, after the metal film 11 is etched, hole formation is performed using each remaining portion of metal film 11 as an alignment mark, and then another resin pattern layer 20 is additionally formed. This is done for a reason that, since a lastly formed resin pattern layer 20 is relatively thick, there is a possibility that positional accuracy of hole formation is decreased in a case where the apertures 21 formed on such thick resin pattern layer are used as alignment marks.

Figure 11A:
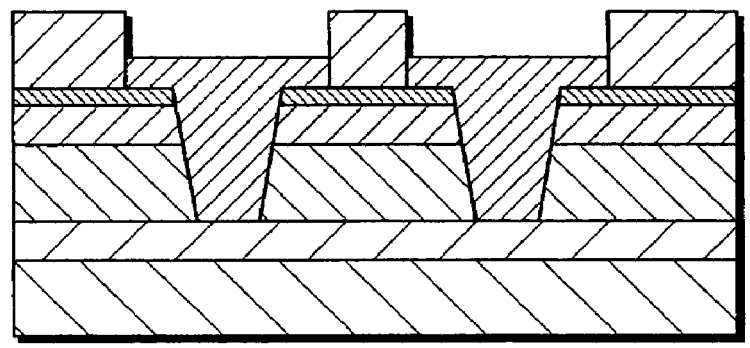
FIGS. 11A and 11B are cross-sectional views showing how each aperture is filled with isotropic elastic conductive paste.

Next, as shown in FIG. 11A, a conductive material is grown by a plating method until it reaches a middle of the resin pattern layer 20 (S807).

Figure 11B:
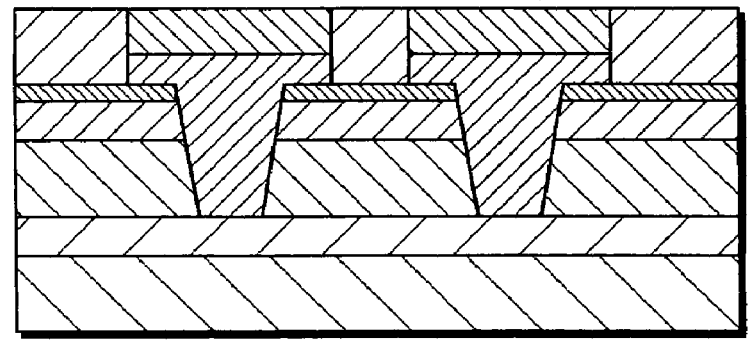

Next, as shown in FIG. 11B, an empty space in each aperture 21 is filled with isotropic elastic conductive paste (S808). Accordingly, isotropic elastic conductors 51 having the same shape as that of their corresponding apertures 21 are formed.

Note that since the isotropic elastic conductor 51 to be filled into each aperture 21 cannot function, when in a pasty state, as an isotropic elastic conductor 51 that maintains electrical continuity, while deforming and recovering its shape, elasticity is given to such isotropic elastic conductor 51 in a pasty state filled into the aperture 21 by a known vulcanization method (S809).

Finally, an unnecessary portion, i.e., the resin pattern layer 20 is removed (S810), the mold base 13 is removed (S811). This method of removing these members is the same as the one described in the second embodiment.

As described above, it is possible to bond the isotropic elastic conductors 51 to the respective bumps 32, while controlling a shape of the isotropic elastic conductors 51 which are relatively great in height.

Furthermore, since the greater the height of the isotropic elastic conductors 51, the higher the compressibility of the bumps as a whole, it is possible to assure effective electrical contacts, that is, electrical conductivity at contacting parts, by absorbing variations, if any, in height of portions on a test subject such as an electrical circuit.

Figure 12:
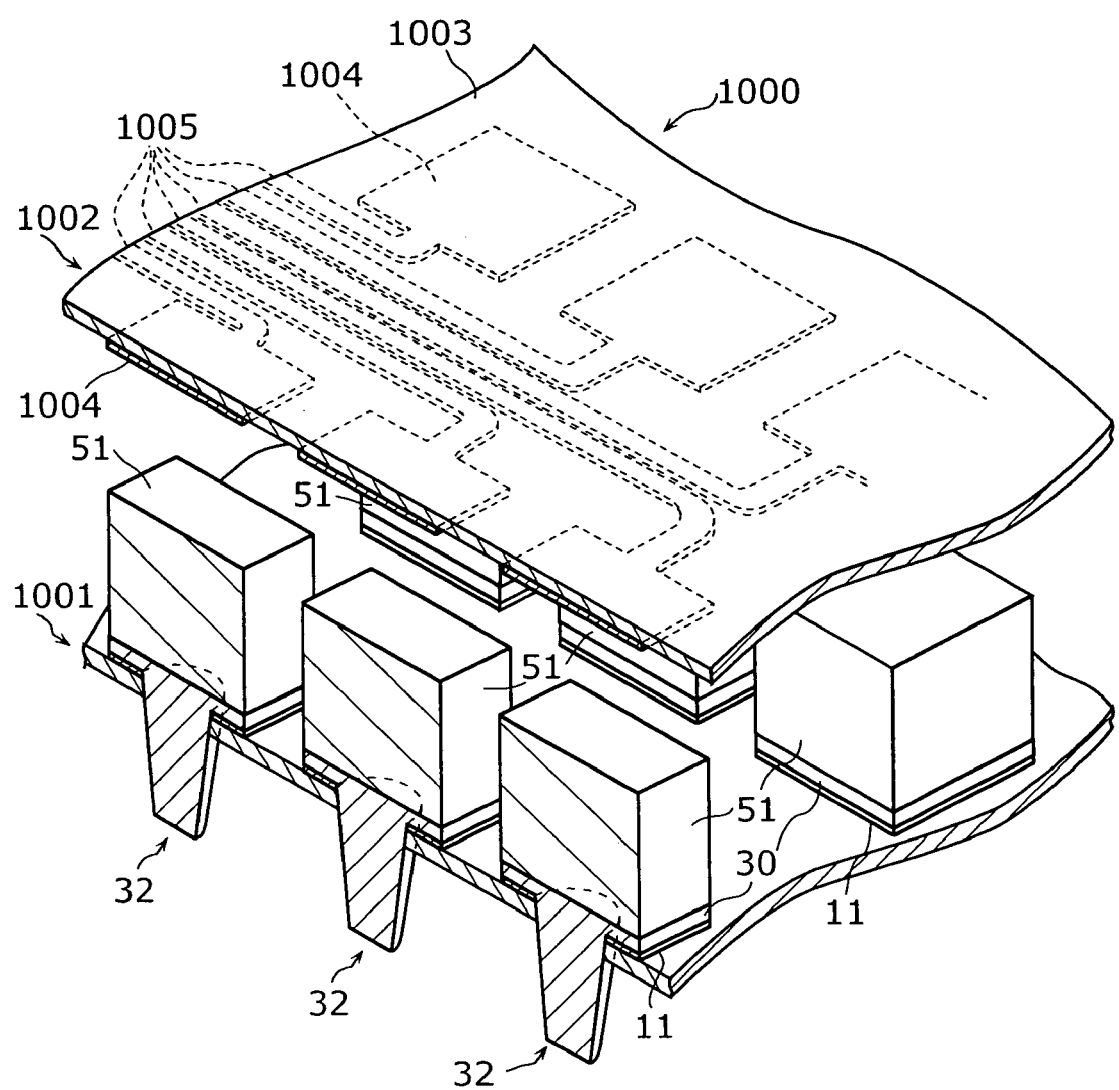
FIG. 12 is an exploded perspective view showing a cutaway part of a probe card having a membrane with bumps.

FIG. 12 is an exploded perspective view showing a cutaway part of a probe card having the above membrane with bumps.

Figure 13:
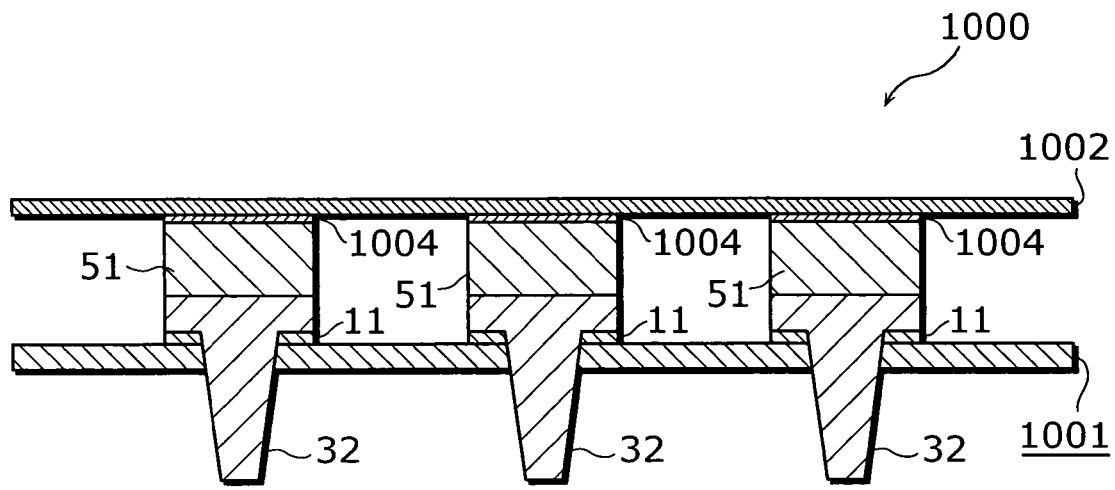
FIG. 13 is a cross-sectional view showing a part of the probe card having the membrane with bumps.

FIG. 13 is a cross-sectional view showing a part of the probe card having the above membrane with bumps.

As shown in these figures, a probe card 1000 includes the above-described membrane with bumps 1001, and a wiring circuit board 1002 for transferring electric signals obtained by respective bumps 32.

The wiring circuit board 1002 is made of a card board 1003, having an insulating property, on an outer surface of which the following are provided as patterns: connection parts 1004 that are connected to the respective bumps; and wirings 1005 that connect such connection parts 1004 with a measuring device not illustrated in FIG. 12. Such wiring circuit board 1002 is intended for transmitting, to the measuring device, all signals from the bumps 32 that are in contact with a test subject such as an electrical circuit.

Despite that an area of electrical continuity between each bump 32 and connection part 1004 is small, at most 0.04 $mm^2$, this probe card 1000 uses the isotropic elastic conductors 51, which are normal conductors, rather than using anisotropic conductive rubber used in conventional technologies. Use of isotropic elastic conductors produces a highly favorable effect in terms of lifetime compared with a case of using anisotropic conductive rubber. This is because isotropic elastic conductors such as isotropic elastic rubber do not undergo any changes in resistance values caused by changes in an arrangement of conductive particles that occur over time.

The present inventor uses isotropic elastic conductors 51 that are obtained by adding, to silicon rubber paste, silver fillers as conductive particles. Furthermore, the present inventor focuses on a shape of the conductive particles, and uses spherical conductive particles. Compared with needle-shaped and scaly conductive fillers, spherical conductive fillers, when their shapes change, do not give much damage to base rubber, and thus there is an advantage of being able to lengthen a lifetime of the base rubber. Furthermore, in order to respond to increasingly infinitesimal areas of the square electrodes 30, an average diameter of spherical conductive particles is set to 20 to 30 μm, as a result of which stable resistivity is assured. This is because it has been proved that, if the diameter of spherical conductive particles is greater than 30 μm, a number of conductive particles that can be arranged in a limited area decreases, resulting in unstable resistance values, whereas if the diameter of spherical conductive particles is less than 20 μm, it is difficult for the conductive particles to be dispersed equally throughout the rubber.

It should be noted that although the above description has been given using isotropic elastic conductors, the present invention is not limited to this. Therefore, other conductors may be used as long as they are elastic conductors.

It should also be noted that although the above-described embodiments use polyimide resin as the insulating base 12, the present invention is not limited to this. Therefore, an arbitrary resin may be used as long as such resin is an insulating resin whose linear expansion coefficient is large and whose form stability is high.

Furthermore, although the above-described embodiments use square electrodes, the present invention is not limited to square as a shape of the electrodes. Therefore, the electrodes may have an arbitrary shape such as round, triangular, and the like.

Also, although the above-described embodiments use a copper thin film as an example of the metal film, the present invention is not limited to copper. Therefore, an arbitrary metal may be used as a material of the metal film.

<Evaluation of Probe Card>

Probe cards having the membranes with bumps manufactured according to the respective methods of the first to third embodiments were prepared, and electrical characteristics tests were conducted using such probe cards. In the tests, plural electrical contacts were simultaneously generated by causing each of the membranes with bumps of the first to the third embodiments to have surface contact with an electrical circuit formed on a wafer. Results of the tests show stable electrical contacts were assured even in a case where a diameter of contacting parts of an electrical circuit being tested is ϕ100 μm.

Furthermore, ten membranes with a large number of bumps 32 were prepared each for a 200 mm wafer and a 300 mm wafer, and the above electrical characteristics tests were also conducted for all of these twenty membranes. Results of the tests show that favorable electric signals were obtained from all the membranes with bumps. It has been confirmed, therefore, that probe cards using the membranes with bumps according to the present invention produce highly favorable yields.

Moreover, several kinds of test subjects having different pitch intervals between adjacent contacting parts of electrical circuits were prepared, and membranes with bumps having corresponding pitch intervals were created, so as to conduct the above electrical characteristics tests. Results of the tests show that even in a case where the pitch interval between contacting parts of an electrical circuit is 80 μm, it was possible to obtain favorable electric signals from the membrane with bumps having the same pitch interval. The diameter of the tip of each convex conductive part 31 was ϕ18 μm±2 μm. It has also been proved that the pitch intervals can be reduced to 30 μm by sharpening a shape of the bumps 32.

More specifically, each of the electrical characteristics tests are conducted as described below.

First, a wafer 2000, and the probe card 1000 corresponding to the wiring pattern of electrical circuits 2001 formed on such wafer 2000, are prepared according to the above-described procedures.

Figure 14:
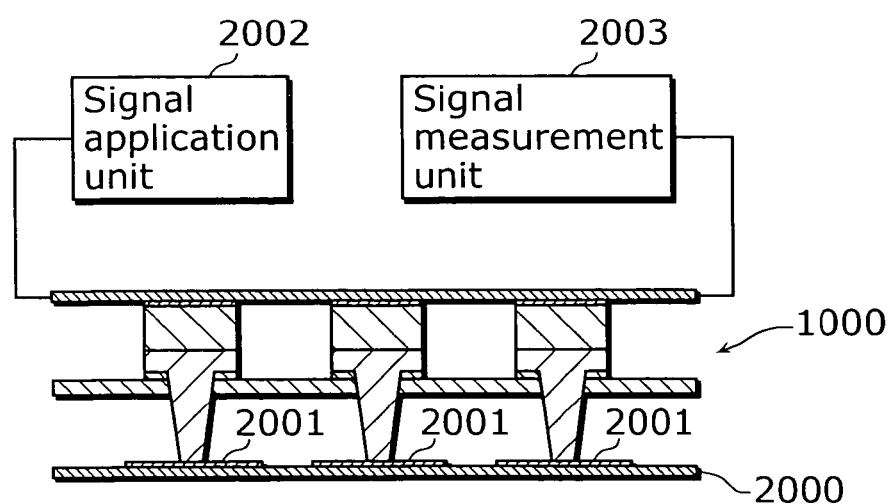
FIG. 14 is a schematic diagram showing how an electrical characteristics test is conducted using the probe card.

Next, as shown in FIG. 14, the probe card 1000 is placed on the wafer 2000. At this stage, tips of the bumps 32 and electrodes on the electrical circuits 2001 should have surface contact.

Next, a signal application unit 2002 applies a high-frequency signal to the electrical circuits 2001 through the probe card 1000. Note that bumps 32 included in the probe card 1000 are categorized into two types, one for signal application and the other for signal reception, depending on how they are wired in the wiring circuit board 1002.

Meanwhile, the signal measurement unit 2003 receives signals by bumps 32, included in the probe card 1000, for signal reception.

As described above, an electrical characteristics test is conducted by comparing a high-frequency signal to be applied and high-frequency signals to be received.

Although only some exemplary embodiments of this invention have been described in detail above, those skilled in the art will readily appreciate that many modifications are possible in the exemplary embodiments without materially departing from novel teachings and advantages of this invention. Accordingly, all such modifications are intended to be included within the scope of this invention.

INDUSTRIAL APPLICABILITY

A method of manufacturing a membrane with bumps according to the present invention contributes to sophistication, lower cost, and stabilized quality of probe cards, and is suitable for probe cards in general that are used to test fine electrical circuits formed on a semiconductor wafer, a liquid crystal display panel, a solar battery, or the like, by causing each of such probe cards to have surface contact with electrodes on an electrical circuit to simultaneously generate electrical contacts.

What is claimed is:

1. A membrane comprising:
   an insulating base;
   bumps positioned at predetermined locations on said insulating base such that said bumps are insulated from each other, each of said bumps including a probe and an electrode, said probe having a diameter that decreases from one end toward another end of said probe, and said electrode having a diameter that is greater than the diameter of said probe at said one end of said probe; and
   a metal film between said electrode and said insulating base,
   wherein said probe penetrates said insulating base in a thickness direction of said insulating base, and a surface roughness at a tip of said each of said bumps is between 1 μm and 3 μm inclusive.

2. The membrane according to claim 1, wherein said metal film comprises a metal film of one of Ni, Cu, and an alloy whose major component is at least one of Ni and Cu.

3. A membrane comprising:
   an insulating base;
   bumps positioned at predetermined locations on said insulating base such that said bumps are insulated from each other, each of said bumps including a probe and an electrode, said probe having a diameter that decreases from one end toward another end of said probe, and said electrode having a diameter that is greater than the diameter of said probe at said one end of said probe; and
   a metal film between said electrode and said insulating base,
   wherein said probe penetrates said insulating base in a thickness direction of said insulating base, and a part of said each of said bumps is an isotropic elastic conductor having a compressibility ratio between 10% and 50% inclusive.

4. A probe card comprising:
   a wiring circuit board having a wiring pattern corresponding to an electrical circuit that includes electrodes which are exposed to outside the electrical circuit and are capable of having electrical continuity outside the electrical circuit; and
   a membrane including
      (i) an insulating base,
      (ii) bumps positioned at predetermined locations on said insulating base such that said bumps are insulated from each other, each of said bumps including a probe and an electrode, said probe having a diameter that decreases from one end toward another end of said probe, and said electrode having a diameter that is greater than the diameter of said probe at said one end of said probe; and (iii) a metal film between said electrode and said insulating base, wherein said probe penetrates said insulating base in a thickness direction of said insulating base, and a part of said each of said bumps is an isotropic elastic conductor having a compressibility ratio between 10% and 50% inclusive.

5. A probe card comprising:

a wiring circuit board having a wiring pattern corresponding to an electrical circuit that includes electrodes which are exposed to outside the electrical circuit and are capable of having electrical continuity outside the electrical circuit; and a membrane including
  (i) an insulating base,
  (ii) bumps positioned at predetermined locations on said insulating base such that said bumps are insulated from each other, each of said bumps including a probe and an electrode, said probe having a diameter that decreases from one end toward another end of said probe, and said electrode having a diameter that is greater than the diameter of said probe at said one end of said probe; and
  (iii) a metal film between said electrode and said insulating base, wherein said probe penetrates said insulating base in a thickness direction of said insulating base, and a surface roughness at a tip of said each of said bumps is between 1 µm and 3 µm inclusive.

6. A method of testing an electrical circuit, comprising:

providing a membrane including
  (i) an insulating base,
  (ii) bumps positioned at predetermined locations on said insulating base such that said bumps are insulated from each other, each of said bumps including a probe and an electrode, said probe having a diameter that decreases from one end toward another end of said probe, and said electrode having a diameter that is greater than the diameter of said probe at said one end of said probe; and
  (iii) a metal film between said electrode and said insulating base, wherein said probe penetrates said insulating base in a thickness direction of said insulating base, and a part of said each of said bumps is an isotropic elastic conductor having a compressibility ratio between 10% and 50% inclusive; and causing said bumps to come into contact with electrodes of the electrical circuit.

* * * * *